(12) United States Patent
Zheng et al.

(10) Patent No.: US 7,574,077 B2
(45) Date of Patent: Aug. 11, 2009

(54) OPTICAL IMAGING DEVICE FOR OPTICAL PROXIMITY COMMUNICATION

(75) Inventors: Xuezhe Zheng, San Diego, CA (US); Ashok V. Krishnamoorthy, San Diego, CA (US); John E. Cunningham, San Diego, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 246 days.

(21) Appl. No.: 11/515,207

(22) Filed: Aug. 31, 2006

(65) Prior Publication Data

US 2007/0075444 A1 Apr. 5, 2007

Related U.S. Application Data

(63) Continuation-in-part of application No. 11/385,445, filed on Mar. 20, 2006, which is a continuation-in-part of application No. 11/243,300, filed on Oct. 3, 2005.

(51) Int. Cl.
*G02B 6/42* (2006.01)
(52) U.S. Cl. .......................................... 385/14; 385/33
(58) Field of Classification Search ........................ None
See application file for complete search history.

(56) References Cited

U.S. PATENT DOCUMENTS

2002/0037132 A1* 3/2002 Sercel et al. .................. 385/30

| | | | | |
|---|---|---|---|---|
| 2005/0077513 A1* | 4/2005 | Fan et al. | .................. | 257/45 |
| 2005/0220411 A1 | 10/2005 | Ilchenko | | |
| 2005/0286602 A1* | 12/2005 | Gunn et al. | .................. | 372/94 |
| 2006/0072875 A1* | 4/2006 | Bhagavatula et al. | .......... | 385/30 |
| 2008/0001062 A1* | 1/2008 | Gunn et al. | .................. | 250/206 |

OTHER PUBLICATIONS

Ming Cai, Oskar Painter, and Kerry J. Vahala, "Observation of Critical Coupling in a Fiber Taper to a Silica-Microsphere Whispering-Gallery Mode System", Physical Review Letters, Jul. 3, 2000, pp. 74-77, vol. 85, No. 1, The American Physical Society.
M. Cai, O. Painter, and K.J. Vahala, "Fiber-coupled microspher laser", Optics Letters, Oct. 1, 2000, pp. 1430-1432, vol. 25, No. 9, Optical Society of America.

(Continued)

*Primary Examiner*—Sung H Pak
(74) *Attorney, Agent, or Firm*—Osha • Liang LLP (57) ABSTRACT

An assembly comprising first and second electronic devices and an optical coupling device that optically couples an optical waveguide on the first electronic device to an optical waveguide on the second electronic device. In this way, optical proximity communication between the devices is possible. The electronic devices may be integrated circuit chips. The first optical waveguide is positioned relative to the optical coupling device to direct an optical signal to the optical coupling device. Further, the second optical waveguide is positioned relative to the optical coupling device to receive the optical signal, which is directed from the optical coupling device to the second optical waveguide. Thus, the optical coupling device optically couples the first optical waveguide to the second optical waveguide.

24 Claims, 8 Drawing Sheets

OTHER PUBLICATIONS

S.M. Spillane, T.J. Kippenberg, and K.J. Vahala, "Ultralow-threshold Raman laser using a spherical dielectric microcavity", Nature, Feb. 7, 2002, pp. 621-623, vol. 415, Macmillan Magazines Ltd.

Yang et al., "A 0.5um CMOS 4 Gb/s serial link transceiver with data recovery using oversampling", IEEE Journal of Solid-State Circuits, May 1998, 10 pages.

Drost et al., "An 8 Gb/s/pin Simultaneously Bidirectional Transceiver in 0.35 micron CMOS", IEEE Journal of Solid-State Circuits, Nov. 2004, 15 pages.

Lee et al., "Low-Power Area Efficient High-Speed I/O Circuit Techniques", IEEE Journal of Solid-State Circuits, Nov. 2000, 9 pages.

Prete et al., "A 100mW 9.6Gb/s Transceiver in 90nm CMOS for Next-Generation Memory Interfaces", 2006 IEEE International Solid-State Circuits Conference, Digest of Technical Papers, Feb. 2006, 10 pages.

Soref et al., "All-Silicon Active and Passive Guided-Wave Components for 1.3 and 1.6um", IEEE Journal of Quantum Electron, vol. QE-22, No. 6, Jun. 1986, 7 pages.

Shoji et al., "Low Loss Mode Size Converter from 0.3um Square Si Wire Waveguides to Single Mode Fibers", Electronics Letters, vol. 38, No. 25, Dec. 2002, 2 pages.

Csutak, et al., "CMOS-compatible planar silicon waveguide-grating-coupler photodetectors fabricated on silicon-on-insulator (SOI) substrates", IEEE Journal of Quantum Electronics, vol. 38, Issue 5, May 2002, 4 pages.

Lipson, M., "Guiding, Modulating, and Emitting Light on Silicon-Challenges and Opportunities", Journal of Lightwave technology, vol. 23, No. 12, Dec. 2005, 17 pages.

Almeida, et al., "Nano-taper mode-size converter", Conference on Lasers and Electro-Optics, CLEO 2003, Jun. 2003, 3 pages.

\* cited by examiner

DISPOSE THE FIRST PORTION OF THE OPTICAL COUPLING DEVICE IN THE FIRST PIT TO OPTICALLY COUPLE THE OPTICAL COUPLING DEVICE TO THE FIRST OPTICAL WAVEGUIDE
510

DISPOSE THE SECOND PORTION OF THE OPTICAL COUPLING DEVICE IN THE SECOND PIT TO OPTICALLY COUPLE THE OPTICAL COUPLING DEVICE TO THE SECOND OPTICAL WAVEGUIDE, WHEREIN THE OPTICAL COUPLNG DEVICE OPTICALLY COUPLES THE FIRST OPTICAL WAVEGUIDE TO THE SECOND OPTICAL WAVEGUIDE
520

OPTICAL IMAGING DEVICE FOR OPTICAL PROXIMITY COMMUNICATION

RELATED APPLICATIONS

This application is a continuation-in-part and claims priority to U.S. patent Ser. No. 11/385,445 filed on Mar. 20, 2006 by Krishnamoorthy et al., entitled "Method and Apparatus for Facilitating Proximity Communication and Power Delivery", which is a continuation-in-part of U.S. patent application Ser. No. 11/243,300, filed on Oct. 3, 2005 by Krishnamoorthy et al., entitled "Method and Apparatus for Precisely Aligning Integrated Circuit Chips". The entire contents of both these applications are incorporated by reference as if fully set forth herein.

This application is related to U.S. patent application Ser. No. 11/515,085, filed on Aug. 31, 2006, by Cunningham et al., entitled "Resonator System For Optical Proximity Communication".

BACKGROUND

The disparity between communication speed on an electronic device such as an integrated circuit or "chip" (on-chip bandwidth) and communication between two chips (off-chip bandwidth) is increasing to a point that the off-chip bandwidth becomes a bottleneck that limits the overall system performance. Factors leading to this increased disparity include continuous scaling of VLSI line-width and increasing on-chip clock speeds. Off-chip communication is expected to become more important with advances in high performance computing systems that are based on a massively parallel architecture.

To improve off-chip bandwidth, work has been done to increase the off-chip data rate using high-speed serial transceivers. However, issues such as topological limits, contact and parasitic RC limits, and power dissipation limits on driving low-impedance off-chip lines limit the off-chip bandwidth that can be achieved using high-speed serial transceivers.

A technique that has been suggested to improve off-chip bandwidth involves the use of photonics on silicon. On-chip communication using photonics involves transmitting optical signals in a waveguide, which may have a sub-micrometer cross-sectional dimension. Communication off-chip involves transmitting optical signals in optical fiber, which may have a cross-sectional dimension of several micrometers, or more.

However, coupling optical signals between the on-chip waveguide and the off-chip optical fiber presents a significant challenge due to the mode mismatch between optical fiber and waveguides. A mode relates to a self-consistent electric field distribution of the optical signal. More particularly, the electric field distribution in question is the component that is perpendicular to the direction in which the optical signal propagates through an optical fiber or waveguide. A waveguide or an optical fiber may have one or more modes in which the electric field distribution of the optical signal is substantially self-consistent as the optical signal propagates (although the phase may change). Largely due to differences in cross-sectional dimensions of waveguides compared to optical fibers, any modes that may exist in a waveguide are typically very different is size from modes that typically exist in an optical fiber. As an example, an on-chip waveguide may have a sub-micrometer mode size, whereas, optical fiber typically has a mode size (or sizes) of about 6-9 micrometers.

Techniques have been devised to couple optical signals from optical fiber to a waveguide. For example, if a sub-micron sized waveguide is tapered at the end, an optical signal from an off-chip optical fiber can be coupled into the tapered end of the waveguide with little loss. This is a broadband approach that can accommodate a large range of wavelengths, but requires the optical fiber/waveguide coupling to be at the edge of the chip, and therefore does not allow a two-dimensional array of couplers to be formed on the surface of the chip. Thus, this technique does not allow wafer-scale optical testing of the waveguides and associated optical devices on the chip that are used to convert the optical signals to electrical signals.

In another technique, gratings have been used to couple surface-normal, or near surface-normal optical signals from optical fiber into sub-micron waveguides with low loss. However, because gratings are typically sensitive to a relatively narrow range of wavelengths, the wavelength bandwidth of the coupler is reduced. The grating is also sensitive to the polarization of the input optical signal, and hence extra coupling loss is unavoidable to achieve a polarization insensitive solution.

Therefore, improved techniques to allow high bandwidth communication between electronic devices, such as integrated circuit chips are desired.

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

SUMMARY

An assembly of electronic devices in which optical proximity communication is possible between features on the electronic devices is described herein. An embodiment in accordance with the present invention is an assembly comprising first and second electronic devices and an optical coupling device that optically couples an optical waveguide on the first electronic device to an optical waveguide on the second electronic device. In this way, optical proximity communication between the devices is possible. The electronic devices may be integrated circuit chips. The optical coupling device may function as a lens.

In one embodiment, the first electronic device comprises a first substrate having a first pit formed therein, and a first optical waveguide. The second electronic device comprises a second substrate having a second pit formed therein, and a second optical waveguide. The optical coupling device has a first portion and a second portion, wherein the first portion of the optical coupling device is disposed in the first pit and the second portion of the optical coupling device is disposed in the second pit. The first optical waveguide is positioned relative to the optical coupling device to direct an optical signal to the optical coupling device. Further, the second optical waveguide is positioned relative to the optical coupling device to receive the optical signal, which is directed from the optical coupling device to the second optical waveguide. Thus, the optical coupling device optically couples the first optical waveguide to the second optical waveguide. Therefore, optical proximity communication between the electronic devices is possible.

The optical coupling device may also serve to control the distance that separates the electronic devices (e.g., z-coordinate alignment). Furthermore, the optical coupling device assists in controlling an x-coordinate and a y-coordinate alignment between the electronic devices. In one embodiment, multiple optical coupling devices are used (with corresponding additional pits) to assist in controlling the x- and y-coordinate alignment between the electronic devices.

An embodiment of the present invention is a method of assembling electronic devices. The method involves assembling: a first electronic device comprising a first substrate having a first pit formed therein, and a first optical waveguide; a second electronic device comprising a second substrate having a second pit formed therein, and a second optical waveguide; and an optical coupling device having a first portion and a second portion. The method comprises disposing the first portion of the optical coupling device in the first pit and disposing the second portion of the optical coupling device in the second pit. The result of assembling the electronic devices is that the first optical waveguide is positioned relative to the optical coupling device to direct an optical signal to the optical coupling device, and the second optical waveguide is positioned relative to the optical coupling device to receive the optical signal, which is directed from the optical coupling device to the second optical waveguide. Thus, the optical coupling device optically couples the first optical waveguide to the second optical waveguide.

BRIEF DESCRIPTION OF THE DRAWINGS

The assemblies and methods described herein are illustrated by way of example, and not by way of limitation, in the Figures of the accompanying drawings. Similar reference numbers are used throughout the drawings to reference similar elements and features.

DETAILED DESCRIPTION OF EMBODIMENT(S)

The assemblies and methods described herein relate to optical proximity communication. For purposes of explanation, numerous specific details are set forth in order to provide a thorough understanding of the various systems and methods. It will be apparent, however, that the systems and methods described herein may be implemented without these specific details. The specification and drawings are, accordingly, to be regarded in an illustrative rather than a restrictive sense.

Optical Coupling of a Waveguide on a First electronic Device to a Waveguide on a Second Electronic Device An optical coupling system is used to optically couple two electronic devices, such as integrated circuit chips, in accordance with an embodiment of the present invention. The optical coupling system has an optical coupling device that optically couples a waveguide on the first device to a waveguide on the second device. The optical coupling device may also serve to align the electronic devices by assisting in controlling x-, y-, and z-coordinate alignment of the electronic devices. Other optical coupling devices may be used to also assist in controlling the x-, y-, and z-coordinate alignment of the electronic devices. In one embodiment, the optical coupling device is used as an optical resonator. In another embodiment, the optical coupling device is used as an optical imaging device (e.g., lens). However, the optical coupling device is not limited to being used as either a resonator or an optical imaging device.

Optical Resonator System

Figure 1:
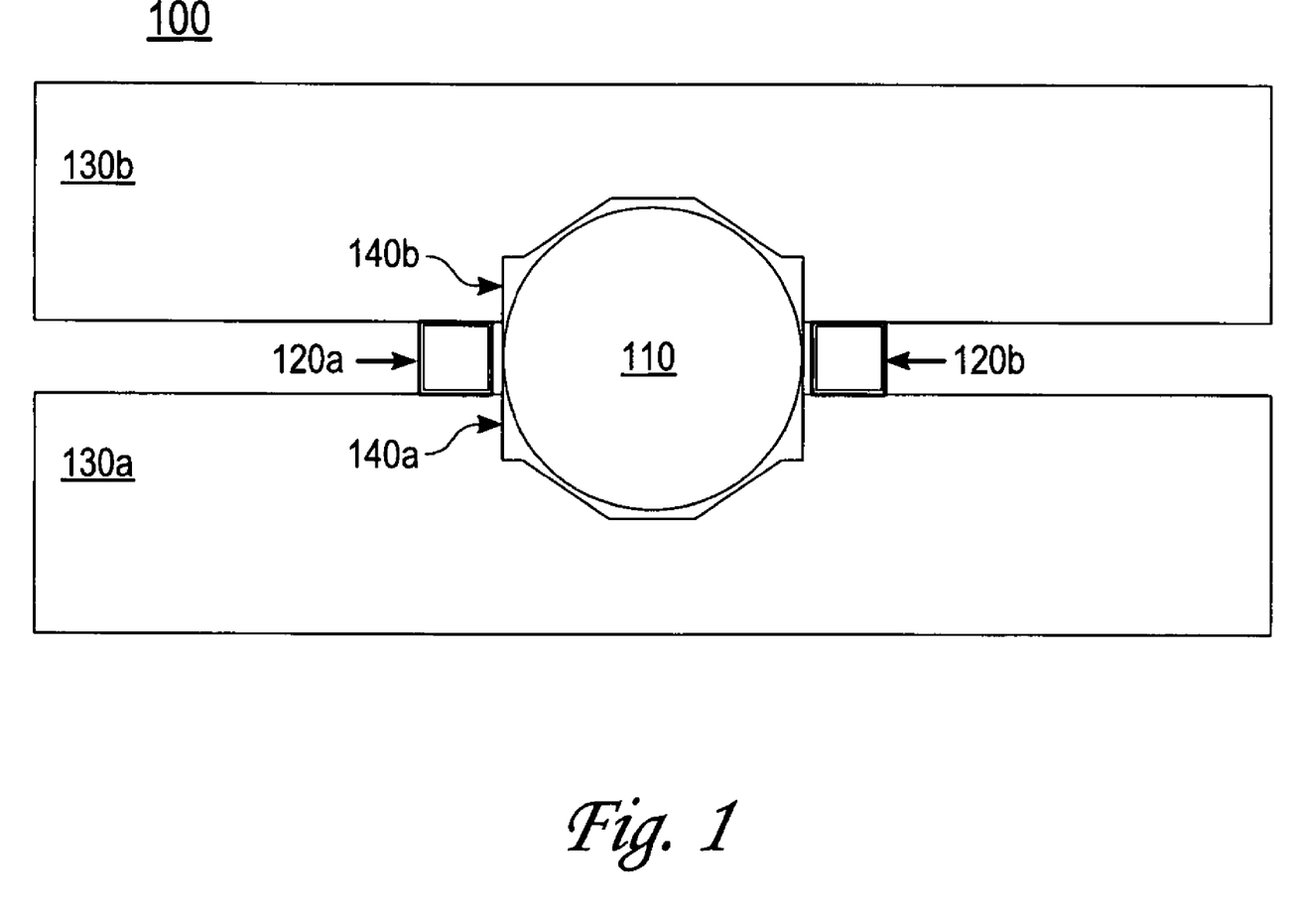
FIG. 1 depicts a cross sectional view of an optical resonator system for optical proximity communication, in accordance with an embodiment of the present invention.

FIG. 1 depicts a cross sectional view of an optical resonator system 100 for optical proximity communication, in accordance with an embodiment of the present invention. Referring to FIG. 1, the optical resonator 110 is used to optically couple two waveguides 120a, 120b (the waveguides are depicted in FIG. 1 as extending into and out of the page) on respective substrates 130a, 130b. Each substrate 120 is a part of an electronic device, such as an integrated circuit. A first waveguide 120a is a feature that may be lithographically formed on substrate 130a. A second waveguide 120b is a feature that may be lithographically formed on substrate 130b. The waveguides are not limited to the particular types depicted in FIG. 1.

The optical resonator 110 is disposed in a first pit 140a that has been etched in a substrate 130a, and is also disposed in a second pit 140b that has been etched in substrate 130b. The pits 140a and 140b are formed to receive the optical resonator 110 in order to precisely align the two waveguides 120a, 120b with the optical resonator 110 to allow optical proximity communication to take place. The waveguides 120a, 120b may be formed by photolithography in order to precisely locate the waveguides 120a, 120b in relation to the pits 140a, 140b.

The optical resonator 110 may be bonded to the pits 140a, 140b using, for example, epoxy or some other bonding material. However, it is not required that the optical resonator 110 be bonded to either pit 140a, 140b. In one embodiment, the two electronic devices are coupled by an apparatus that applies sufficient force to hold the electronic devices together with the optical resonator 100 disposed in the pits 140a, 140b.

Optical resonators may be used to spatially confine resonant optical energy in a limited cavity. Electromagnetic energy can be coupled into or out of an optical resonator. Optical resonators may be fabricated in many different shapes, one example of which is a sphere. An optical signal that is coupled into a spherical optical resonator is confined in a circular path by total internal reflection around the inner surface of the sphere. Some portion of the optical signal may escape the spherical optical resonator.

Once inside of the resonator, the optical signal that escapes is very weak. A technique referred to as evanescent coupling is used to get the optical signal to escape. As an example, an optical fiber or waveguide is placed very close to the edge of the sphere (possibly, though not necessarily touching, the sphere) to induce the optical signal to come out. The optical fiber or waveguide is so close that the light in the sphere overlaps the core of the optical fiber or waveguide.

Figure 2:
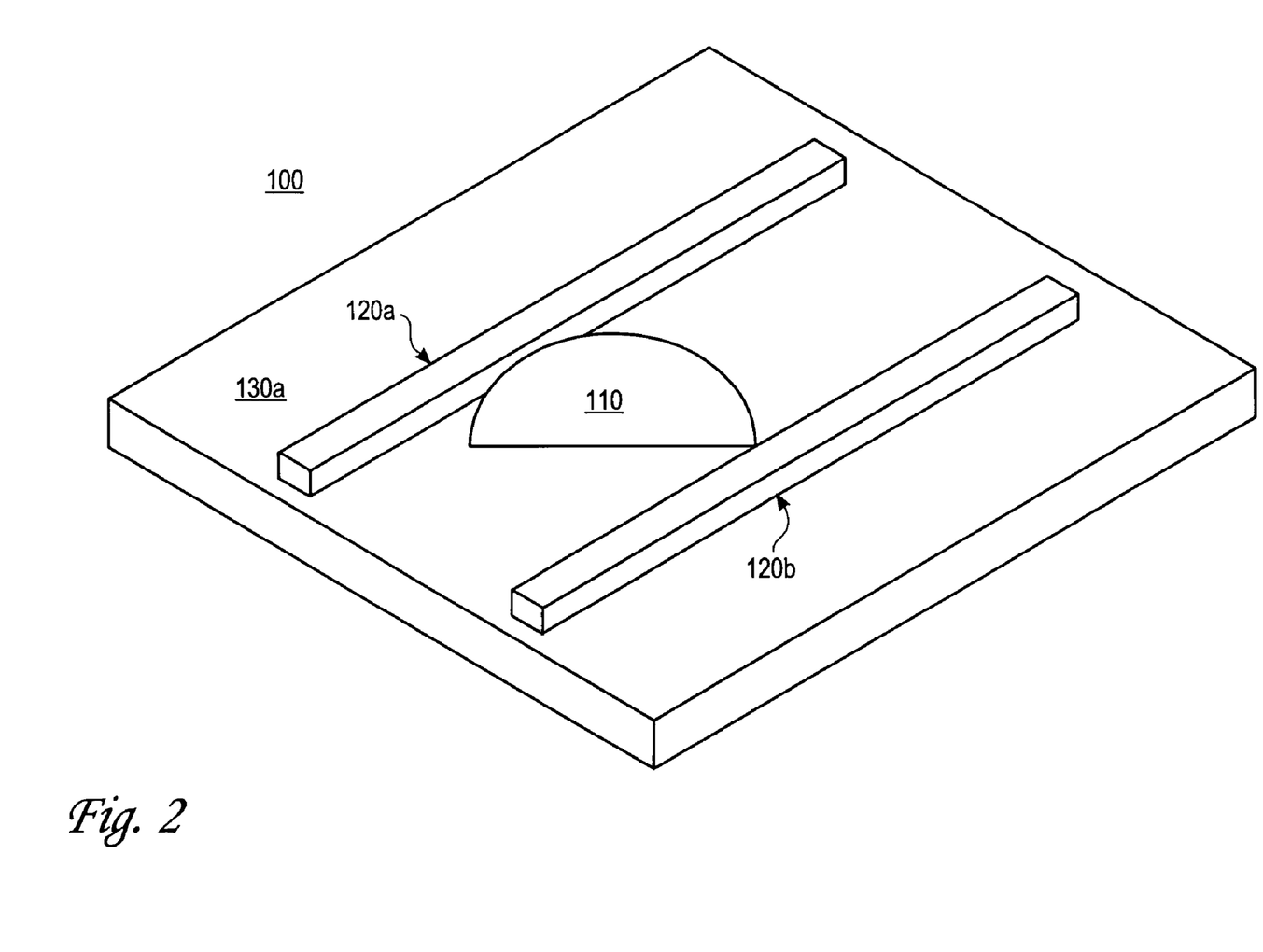
FIG. 2 is a perspective view of a portion of the optical resonator system of FIG. 1, in accordance with an embodiment of the present invention.

FIG. 2 is a perspective view of the optical resonator system 100 of FIG. 1 with substrate 130b not depicted. At least a portion of each waveguide 120a, 120b is located in close proximity to the optical resonator 110 (waveguide 120b is depicted in dashed lines to indicate that it is not a feature of substrate 130a). By close proximity it is meant close enough to allow optical coupling (e.g., evanescent) between a waveguide 120a, 120b and the optical resonator 110. A waveguide 120 may comprise a core having a first index of refraction and an outer cladding layer having a second index of refraction. In order to facilitate evanescent coupling between a waveguide 120 and the optical resonator 110, a portion of the cladding layer may be removed in the portion of the waveguide 120 that will be in close proximity to the optical resonator 110.

In the present embodiment, two waveguides 120a, 120b and optical resonator 110 form a four port optical system. Each waveguide 120a, 120b may have an add port and a drop port. During operation, an optical signal source (not depicted in FIG. 2) is used to pump an optical signal into one of the waveguides (e.g., 120a). An optical signal from waveguide 120a can be coupled into the optical resonator 110, then be optically coupled to the waveguide 120b. The optical signal may be induced to enter and exit the optical resonator 110 via evanescent coupling. In a similar fashion, to communicate information in the other direction, an optical signal may enter the optical resonator 110 from waveguide 120b and exit the optical resonator 110 to waveguide 120a.

In accordance with one embodiment, the optical resonator 110 comprises a spherical shape. The sphere may be positioned such that its equator aligns with the cores of both waveguides 120a, 120b and thereby forms a plane. The separation from the edge of the equator of the optical resonator 110 to the core of a waveguide 120 determines the coupling constant. The coupling does not need to be strong because the Q (optical quality factor) of the sphere may be large (e.g., on the order of $10^7$). The sphere forms Whispering Gallery Modes (WGM) of excitation, wherein the majority of the optical signal is concentrated near the inner surface of the sphere along the equator. However, a portion of the optical signal energy exists as an evanescent field just outside of the sphere. Thus, a waveguide in close proximity to the sphere can be evanescently coupled to the sphere.

A sphere is a 3D resonator allowing other coupling geometries. Thus, it is not required that the portion of the sphere that is aligned with the waveguides be the equatorial plane. Moreover, the optical resonator 110 is not required to have a spherical shape. Other possible shapes for the optical resonator 110 include, but are not limited to, elliptical, disk, torous, and donut.

The optical resonator may be formed out of any material that is substantially transparent to an optical signal having a desired transmission frequency. Examples of suitable materials include, but are not limited to, sapphire, quartz, and glass.

As will be discussed more fully below, the optical resonator system 110 allows optical information to be transmitted in a multi-wavelength domain. Thus, optical signals can be transmitted over the waveguides using wavelength-division multiplexing.

Optical Amplification

In accordance with an embodiment of the present invention, the optical resonator is doped to allow optical signal amplification. In one embodiment, the doping is done with Erbium (Er) atoms. Erbium ions, when pumped by 980 nanometer (nm) or 1490 nm light can be put in an excited state such that a band of 1550 nm light will undergo stimulated lasing emission out of the sphere. Such amplifiers have optical gain (e.g., 30 dB or more). The optical resonator 110 may be doped by diffusion or an implantation process.

By introducing a 980 nm light beam in one of the two input waveguides to the optical resonator 110, the optical resonator 110 can be populated with Er ions, which are set to lase within the gain band of the Er+ions. Addition of a small signal wavelength at the second waveguide input will stimulate the excited state Er ions in the sphere to emit that same wavelength with amplification.

Figure 4:
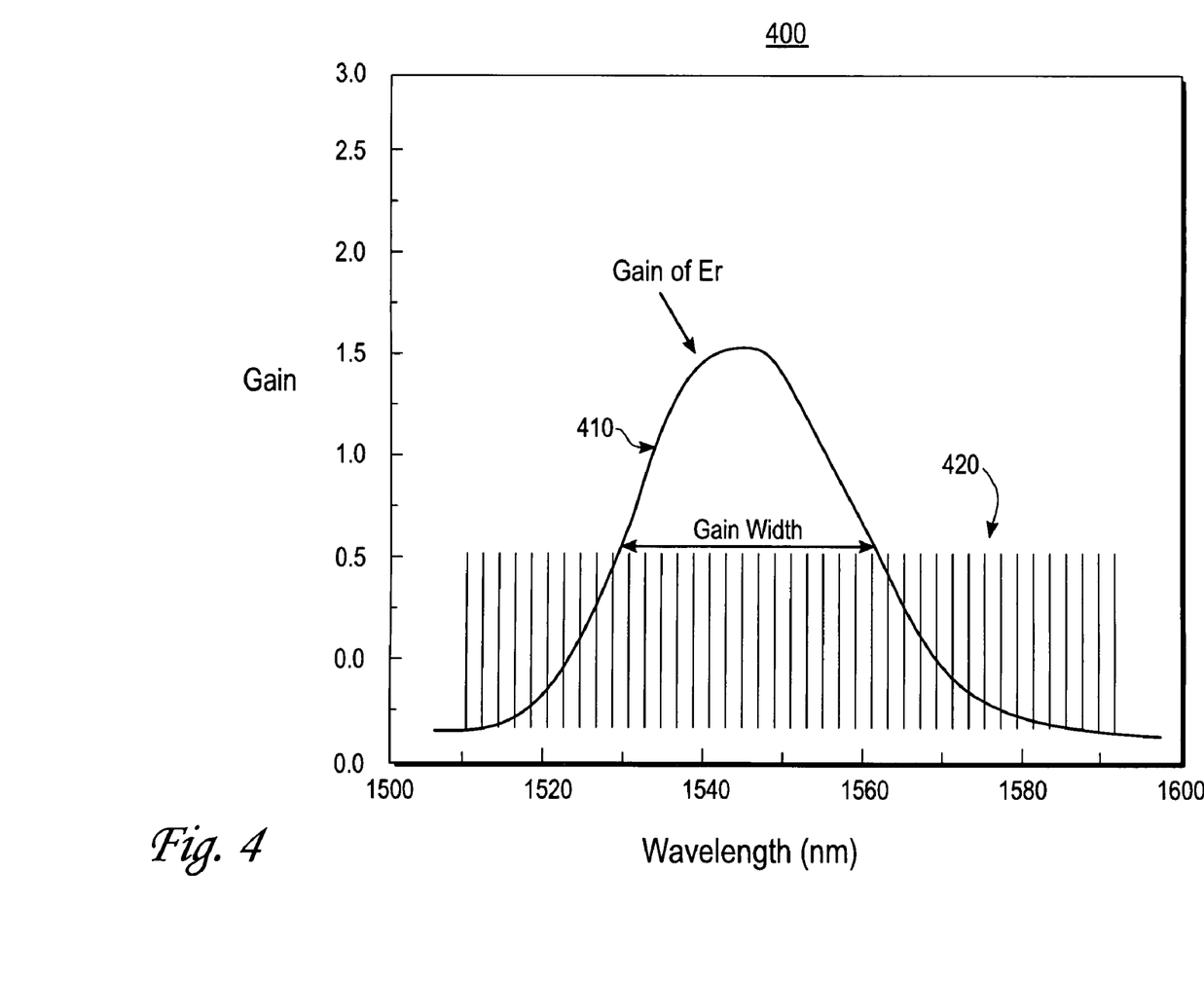
FIG. 4 is a graph having a curve illustrating amplified lasing emission when doping an optical resonator with Erbium, in accordance with an embodiment of the present invention.

An example of the amplified lasing emission when doping the optical resonator 110 with Er is shown in the graph 400 of FIG. 4, in accordance with an embodiment of the present invention. Graph 400 depicts a curve 410 of the gain of an Er doped spherical resonator versus wavelength. The actual emission of the lasing spectrum is controlled by the gain spectrum of the Er ions. The gain width is about 35 nm wide and is centered at about 1540 nm.

The optical resonator 110 (which in this example is a sphere) also has eigenmodes for resonant excitation. These wavelengths correspond to the excitations dictated by the Whispering Gallery Modes (WGM) 420 of the optical resonator 110. The overlap of the gain spectrum 410 and the WGM 420 of the optical resonator 110 determine wavelengths for lasing amplification. As an example, the WGM 420 in graph 400 can be achieved by using a 200 micron spherical resonator. This grid or spacing between the wavelengths is a function of the diameter of the sphere. Therefore, the spacing of the WGM 420 can be controlled by using a sphere having an appropriate diameter. By using the different wavelengths to transmit different signals, wavelength-division multiplexing is achieved.

Rather than using a 980 nm light beam, as previously discussed, other wavelengths can be used, although with possibly less efficiency. As an example, any wavelength between 980 nm and 1530 nm might be used.

The optical resonator may be doped with a material other than Er. For example, other rare earth species could be used. As particular examples, the optical resonator could be doped with any of the following (but not limited thereto): Neodymium (Nd), Holmium (Ho), Yttrium (Y), or Dysprosium (Dy). When doping with other than Er, a different frequency of optical signal may be used for the light beam that is introduced to the optical resonator to stimulate the doping material.

Pits for Receiving Optical Coupling Devices

The pits 140 in which the optical coupling device (including, but not limited to, optical resonator and optical imaging device) is disposed have an inverted pyramid shape, in accordance with one embodiment. However, the pits 140 may have a different shape. In one embodiment of the present invention, the pits 140 are micro-machined into silicon integrated circuit chips. These micro-machined structures can be formed photo-lithographically (as can the waveguides), which allows the pits 140 to be photo-lithographically defined in relationship to the waveguides. This photolithographic alignment between the pits 140 and waveguides enables the top and bottom waveguides to be precisely aligned with the optical coupling device to allow optical proximity communication. The size and shape of the pits 140 are designed to receive the optical coupling device. The pits 140 may be etched such that the equator of the optical coupling device will be just above the surface of the substrate. This allows the gap between the two electronic devices to be precisely controlled. Moreover, this allows the waveguides to be properly positioned relative to the optical coupling device.

In one embodiment, the pits 140 are etched in a silicon substrate. When etching a "100" silicon surface, the angle of the pit is set by the "111" planes. For example, the depth proceeds with an etch that removes all planes but the "111" planes. This etch is dictated by local silicon chemistry between solute and silicon. Eventually, as the etch proceeds through a defined opening in a "100" surface, four "111" facets are exposed. Note that the etching process is not required to attack "111" planes. The bottom of the pits 140 may become less perfect since the reactions may become mass-transport limited. However, it is not required that the bottom of the pit be perfectly formed because it is not required that the bottom of the pit physically contact the optical coupling device. Furthermore, note that the pits 140 may have other orientations and other shapes including, but not limited to, truncated spheres, prisms, and hexagons.

Optical Proximity Communication in a Tiled Array of Chips

Figure 3:
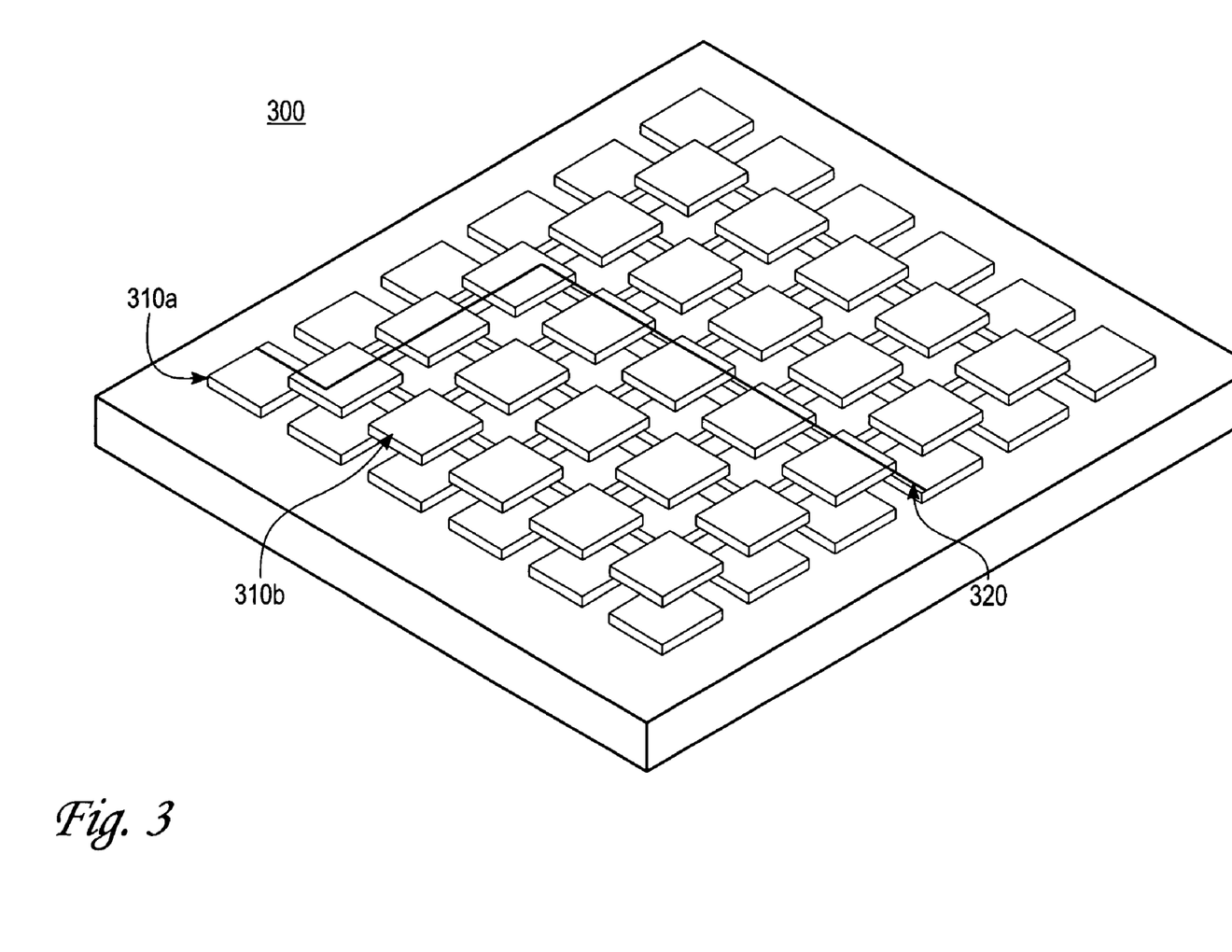
FIG. 3 depicts an example of an array of electronic devices that are coupled to allow optical proximity communication, in accordance with an embodiment of the present invention.

FIG. 3 depicts an array 300 of chips that are optically coupled to allow optical proximity communication. The array 300 has a number of lower chips (e.g., chip 310*a*) and a number of upper chips (e.g., 310*b*). Each of the upper chips overlaps with four lower chips, in this embodiment. Thus, a particular upper chip has four of the optical resonator systems 100 depicted in FIG. 1 and FIG. 2.

Path 320 across the array 300 is achieved by using optical proximity coupling from a lower chip to an upper chip, and then to a lower chip etc, across the array 300. Thus, optical traffic can flow across the multi-chip array 300 seamlessly and transparently without opto-electronic conversion on any chip, in accordance with an embodiment of the present invention. Thus, increased latency that would occur due to opto-electronic conversions is avoided.

The optical coupling device may be used to achieve optical proximity communication in the tiled array 300. In accordance with one embodiment, the optical coupling device is an optical resonator. In accordance with another embodiment, the optical coupling device is an optical imaging device (e.g., a lens), as discussed below. However, the optical coupling device is not limited to being an optical resonator or an optical imaging device. Further, the optical resonator system 100 depicted in FIGS. 1 and 2 can be used with configurations other than that of FIG. 3. The optical imaging device, discussed herein can be used with configurations other than that of FIG. 3.

Figure 5:
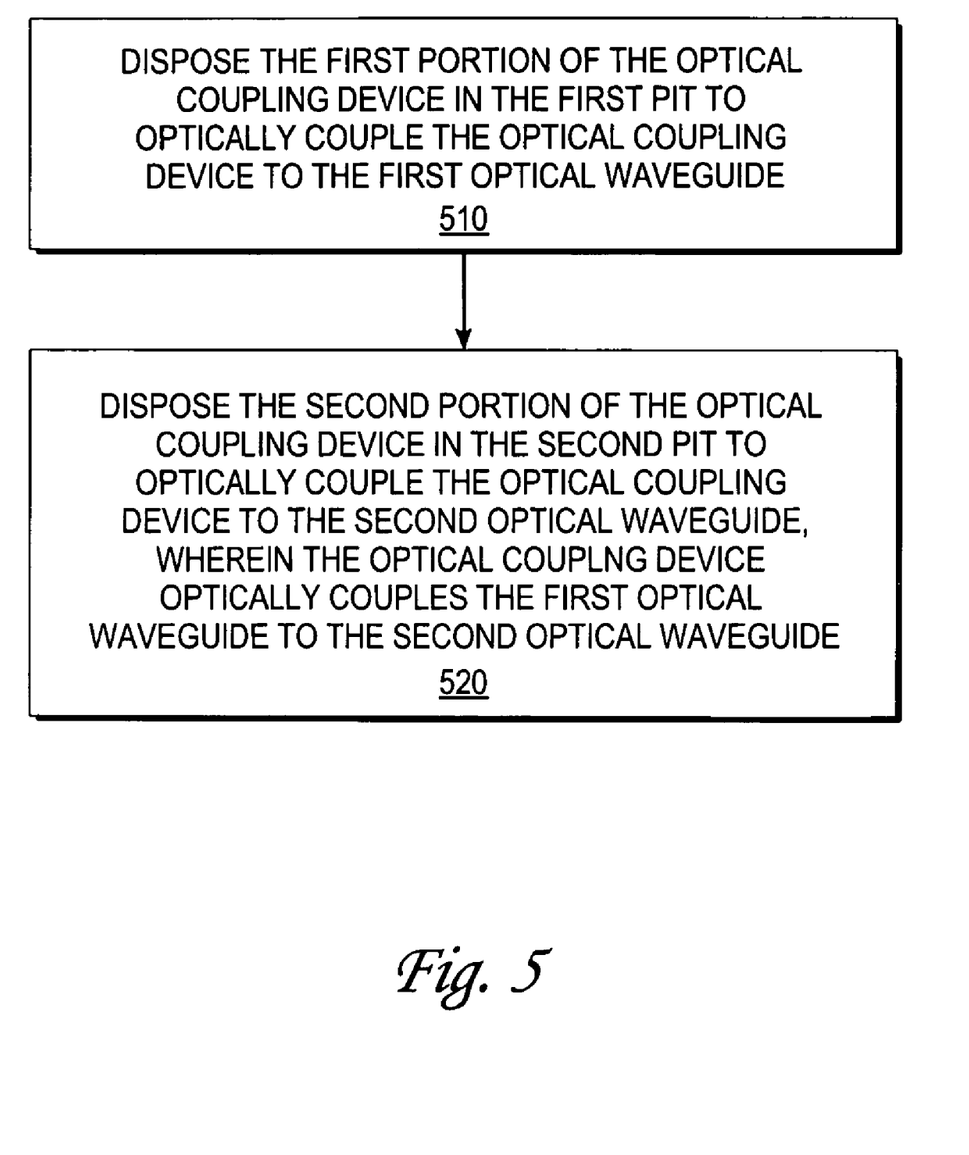
FIG. 5 is a flowchart illustrating a process of assembling electronic devices to allow optical proximity communication, in accordance with an embodiment of the present invention.

Process for Assembling Electronic Devices to Allow Optical Proximity Communication FIG. 5 is a flowchart illustrating a process 500 of assembling integrated circuits to allow optical proximity communication, in accordance with an embodiment of the present invention. The process 500 describes how two electronic devices can be assembled to allow optical proximity coupled therebetween. The process 500 involves assembling: a first electronic device comprising a first substrate having a first pit formed therein, and a first optical waveguide defined on the first substrate; a second electronic device comprising a second substrate having a second pit formed therein, and a second optical waveguide defined on the second substrate; and an optical coupling device having a first portion and a second portion. In accordance with one embodiment, the optical coupling device is an optical resonator. In accordance with another embodiment, the optical coupling device is an optical imaging device (e.g., a lens), as discussed below. However, the optical coupling device is not limited to being an optical resonator or an optical imaging device. Process 500 will be discussed by reference to the optical resonator system 100 depicted in FIGS. 1-2; however, process 500 is not limited to that embodiment.

In step 510, the first portion of the optical coupling device (e.g., resonator, imaging device) is disposed in the first pit to optically couple the optical resonator to the first optical waveguide. For example, after the electronic device having substrate 130*a*, pit 140*a*, and waveguide 120*a* is formed, optical resonator 110 is disposed in pit 140*a*. For purposes of description, electronic device having substrate 130*a* may be referred to as a "lower device". The optical coupling device may be bonded to pit 140*a*; however, bonding is not required.

In step 520, the second portion of the optical coupling device (e.g., resonator, imaging device) is disposed in the second pit to optically couple the optical coupling device to the second optical waveguide. For example, after the electronic device having substrate 130*b*, pit 140*b*, and waveguide 120*b* is formed, optical resonator 110 is disposed in pit 140*b*. For purposes of description, electronic device having substrate 130*b* may be referred to as an "upper device". The optical coupling device 110 may be disposed in pit 140*b* by placing the upper device onto the lower device. Note that the initial placement is not required to be highly precise because the optical resonator 110 serves to guide the upper device into precise alignment with the lower device.

Thus, the first portion of the optical resonator is disposed in the first pit to optically couple the optical resonator to the first optical waveguide, and the second portion of the optical resonator is disposed in the second pit to optically couple the optical resonator to the second optical waveguide, in accordance with one embodiment. Thus, the optical resonator 110 optically couples the first optical waveguide 120*a* to the second optical waveguide 120*b*. The optical resonator may be bonded to pit 140*b*; however, bonding is not required.

As previously discussed, in one embodiment, the optical coupling device is an optical imaging device. In this embodiment, after assembling the electronic devices, the first optical waveguide is positioned relative to the optical coupling device to direct an optical signal to the optical coupling device, and the second optical waveguide is positioned relative to the optical coupling device to receive the optical signal, which is directed from the optical coupling device to the second optical waveguide. Thus, the optical coupling device optically couples the first optical waveguide to the second optical waveguide.

In one embodiment of the present invention, a force is supplied to hold the upper and lower devices together. This force is supplied by a compliant, suspension connector system that eliminates chip separation, in accordance with one embodiment. The connector system provides sufficient compressive force on the chips to maintain the optical resonator within the pits, thereby maintaining the relationship between the waveguides and the optical resonator that allows optical proximity communication. This connector system may be designed to provide some freedom of motion to allow the upper device to accurately mate with the lower device. Note that the compressive force is sufficient to allow the final resting orientation to be determined by the optical resonator, while also assuring that the devices maintain proper spacing once mated.

Process 500 can be extended to assemble more than two electronic devices. As an example, a tiled array of electronic devices can be assembled, wherein optical proximity communication is possible from one electronic device to the next such that optical communication is possible across the entire array without converting from optical transmission to electrical transmission.

Process 500 allows the alignment of the waveguides to be accomplished in a passive manner. For example, it is not required that the waveguides be illuminated during the assembly process to facilitate alignment,

Optical Imaging System

Figure 6A:
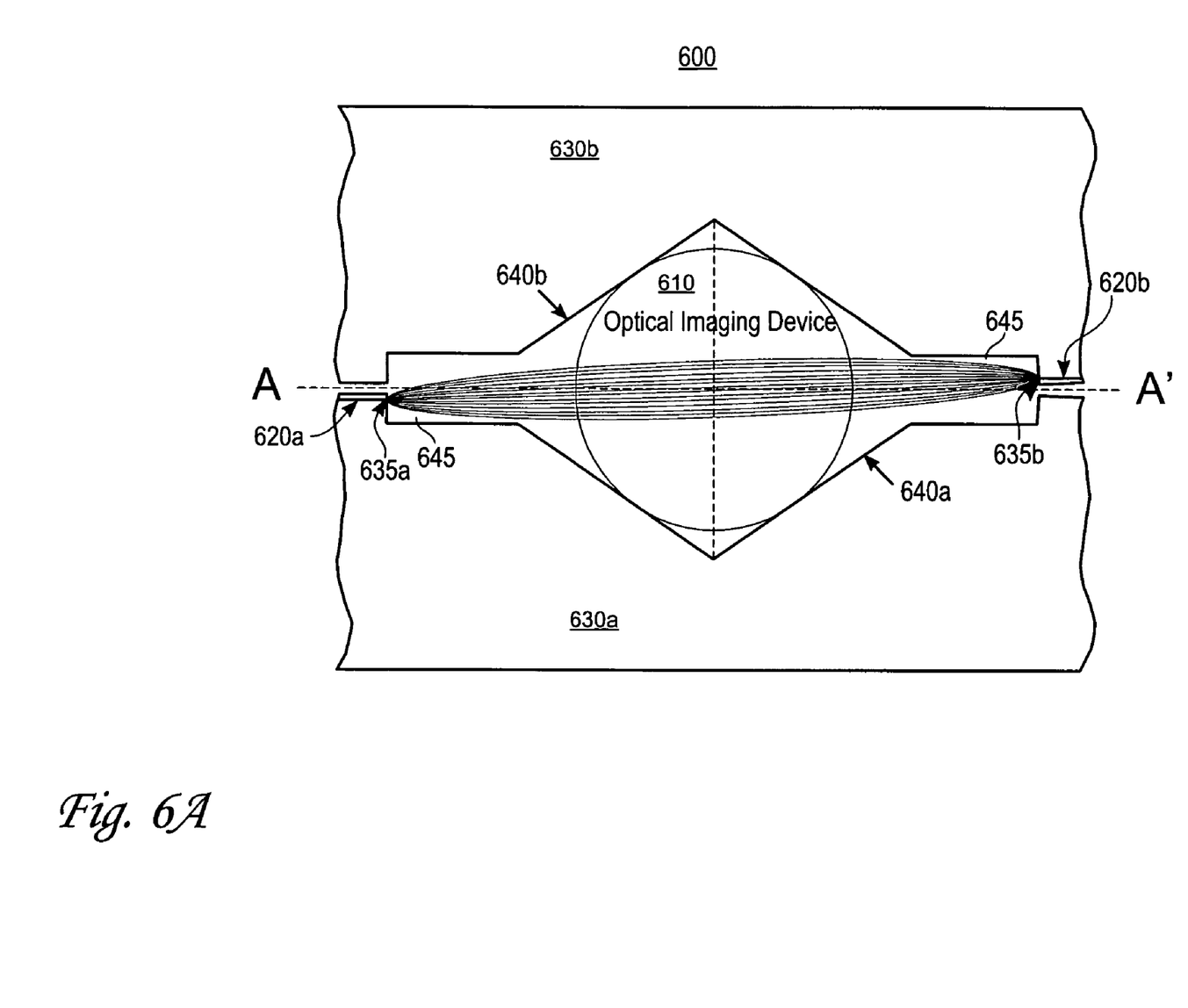
FIG. 6A depicts a cross sectional view of an optical imaging system for optical proximity communication, in accordance with an embodiment of the present invention.
Figure 6B:
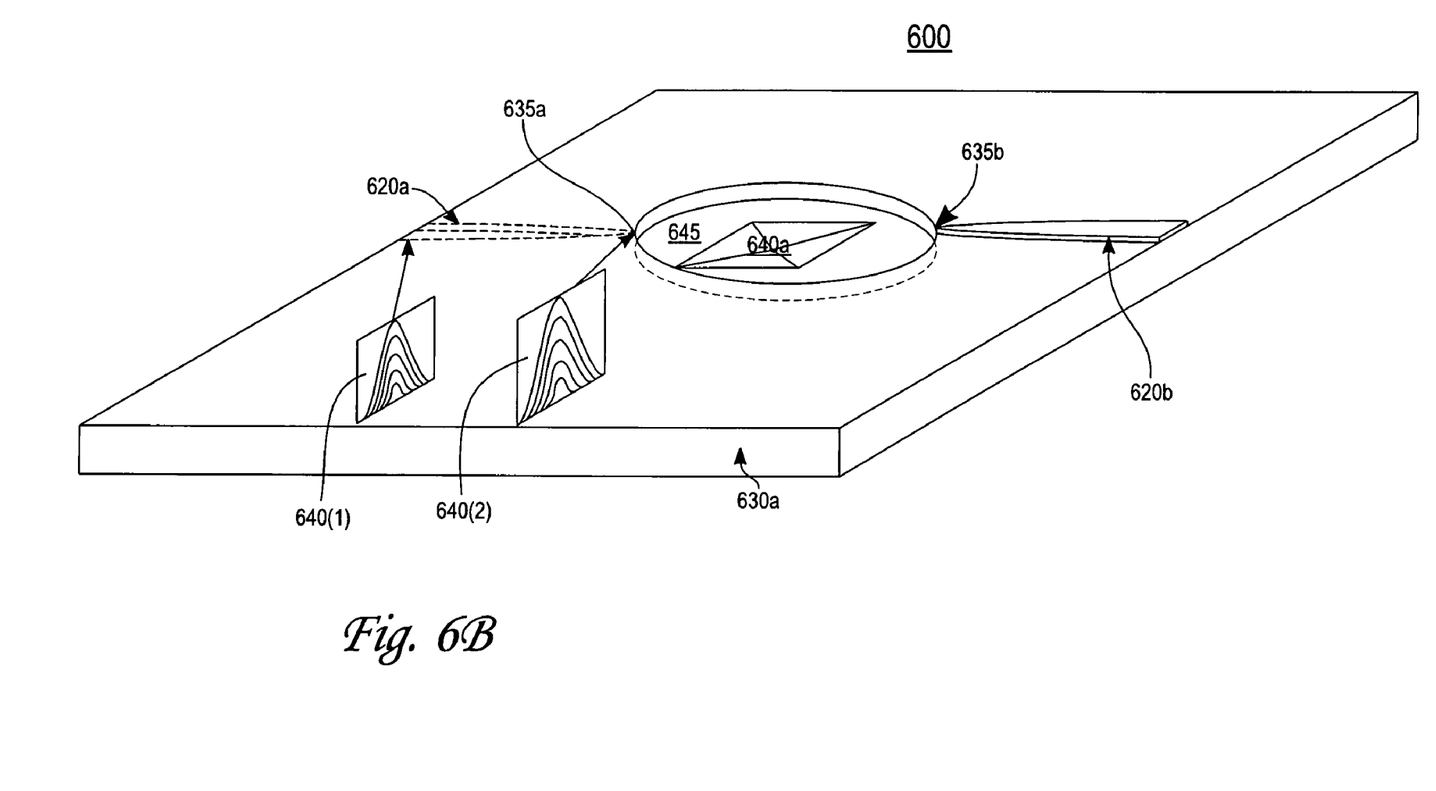
FIG. 6B is a perspective view of a portion of the optical imaging system of FIG. 6A, in accordance with an embodiment of the present invention.

In accordance with another embodiment of the present invention, the optical coupling device acts as an imaging device (e.g., a lens). An example configuration for optical coupling, using an optical imaging device, of two face-to-face electronic devices (e.g., integrated circuit chips) is depicted in FIG. 6A and FIG. 6B. FIG. 6A depicts a cross-sectional view, and FIG. 6B depicts a top perspective view without the upper electronic device 630b and the optical imaging device 610.

Referring to FIG. 6A, the optical imaging device 610 is used to optically couple two waveguides 620a, 620b on respective substrates 630a, 630b. Each substrate 630a, 630b is a part of an electronic device, such as an integrated circuit. A first waveguide 620a is a feature that may be lithographically formed on or in substrate 630a. A second waveguide 620b is a feature that may be lithographically formed on or in substrate 630b.

An optical signal from the tip 635a of the first optical waveguide 620a is directed to the optical imaging device 610, which acts as a lens. The optical signal at the tip 635a may be referred to as an "object signal". The second optical waveguide 620b receives the optical signal from the optical imaging device 610. In other words, the optical imaging device 610 directs the optical signal to the tip 635b of the second optical waveguide 620b. The optical signal at the second waveguide tip 635b may be referred to as an "image signal". Thus, the optical coupling device 610 acts as a lens (or imaging device) to direct the "image signal" to the second waveguide tip 635b based on the "object signal" at the first waveguide tip 635a. Therefore, the first optical waveguide 620a is optically coupled to the second optical waveguide 620b, which allows optical proximity communication between the first and second electronic devices 630a, 630b.

Waveguides

A Silicon waveguide typically has a sub-micrometer cross-sectional size and provides strong confinement to the optical signal propagating within. However, when an optical signal (e.g., an optical beam) leaves an optical waveguide it may diverge. If the optical signal diverges too much, then the optical imaging device 610 will not properly receive the optical signal. In accordance with one embodiment, the waveguides 620 are tapered at the end nearest the optical imaging device, which may prevent or reduce the optical signal's divergence. Referring to FIG. 6B, the portions of each waveguide 620a, 620b that are closest to the optical imaging device 610 are narrower (tapered) than other portions of the waveguides 620a, 620b.

Tapering the waveguides converts the sub-micrometer mode of the waveguide to a mode having a significantly larger size. Referring to FIG. 6B, the mode 640(1) corresponding to a point in which the optical signal is within a wider section of waveguide 620a is depicted as relatively large. However, near the waveguide tip 635a, the mode 640(2) is depicted as larger (e.g., it has a larger cross-sectional area). The modes 640(1), and 640(2) are not drawn to scale. Rather, mode 640(2) may be much larger than mode 640(1). While not depicted in FIG. 6B, the second waveguide 620b also has a mode, which is expanded by its tapered end. This configuration with both waveguides 620a, 620b having a relatively large mode allows an optical signal to be coupled from the first waveguide 620a to the second waveguide 620b (and also the reverse) with little loss.

In one embodiment, one or both of the waveguides have a single mode. Expanding the mode, as previously described, is achieved while preserving the single mode nature of the waveguides.

Techniques other than tapering the end of the waveguide can be used to convert the mode of the waveguide to a larger mode. Moreover, it is not required that the mode be expanded. For example, depending on factors such as the cross-sectional dimension of the waveguides, the optical properties of the optical imaging device, and tolerance in positioning the waveguides and optical coupling device, the optical signal may be coupled from one waveguide to the other without significant loss even if the mode is not expanded.

Optical Imaging Device

When assembled, the optical imaging device 610 is disposed in a first pit 640a that has been etched in a substrate 630a, and is also disposed in a second pit 640b that has been etched in substrate 630b. The pits 640a and 640b are formed to receive the optical imaging device 610 in order to precisely align the two waveguides 620a, 620b with the optical imaging device 610 to allow optical proximity communication to take place.

The optical imaging device 610 can be fabricated from a material for which the index of refraction does not vary significantly for wavelength ranges typically used in silicon photonics. Thus, optical coupling of the waveguides through the optical imaging device 610 can be essentially insensitive to wavelength. Note that the distance from the tips of the waveguides to the optical imaging device 610 is suitable for a wide range of wavelengths. Therefore, the optical imaging device 610 provides a true broadband solution. Furthermore, the optical imaging device 610 is polarization insensitive, in accordance with an embodiment, because lens imaging is not sensitive to the polarization.

Tap

In accordance with one embodiment of the present invention, a tap 645 is formed around each pit 640a, 640b. When viewed from the top, the tap 645 may have a circular shape. However, the tap 645 may have other shapes. The tap 645 serves to establish the distance between a waveguide tip 635a, 635b and the optical imaging device 610. The distance may be based on the optical properties of the optical imaging device 610. Thus, the optical imaging device 610 can focus the optical signal at a target spot to allow a waveguide to receive the optical signal. The tap 645 has a depth to create enough clearance for the optical signal to propagate between the waveguides 620a, 620b and the optical imaging device 610.

Example Operation

The following describes an example operation for coupling an optical signal (e.g., optical beam) from the first optical waveguide 620a to the second optical waveguide 620b using an optical image device. An optical signal can also be coupled from the second optical waveguide 620b to the first optical waveguide 620a. The optical signal from waveguide 620a exits as an object signal. The object signal is characterized by the mode 640(2) in FIG. 6B. The first optical waveguide 620a is positioned such that it is a slightly off-axis source to the optical imaging device 610, in accordance with one embodiment. Referring to FIG. 6A, the tip 635a of the first optical waveguide 620a is just below the axis of the optical imaging device A-A'. The optical imaging device 610 acts as a lens to image the object signal into an image signal a known distance away at the opposite side of the optical imaging device 610. The image signal is not depicted in either FIG. 6A or FIG. 6B, but would be approximately near the tip 635b of the second optical waveguide 620b.

In accordance with one embodiment, the optical imaging system is symmetrically designed. That is, the distance from the first optical waveguide tip 635a to the center of the optical imaging device 610 ("object distance") is the same as the distance from the second optical waveguide tip 635b to the center of optical imaging device 610 ("image distance"). For convenience of explanation, the following discussion is based on a symmetrical design. However, it is not required that such a symmetrical design be used.

If the object distance is chosen, based on the size and material of the optical imaging device 610, to achieve 1:1 imaging through the optical imaging device 610, the object signal and image signal will be symmetrical to the center of the optical imaging device 610 in both size and position. Thus, the size of the image signal will be the same as the size as the object signal. Also, note that the symmetry implies that an object signal at the second waveguide tip 635b will have the same size as an image signal at the first waveguide tip 635a. While it is not required that the image signal and object signal be the same size, having them the same size may be beneficial in efficiently coupling optical signals between the first waveguide 620a and the second waveguide 620b.

Wavelength division multiplexing (WDM) is implemented to multiplex multiple optical signals into a single waveguide (e.g., 620a), image them through the same optical imaging device 610, and couple them into the waveguide (e.g., 620b) on the other chip to achieve high bandwidth-density product, in accordance with one embodiment.

Multiple Channel Communication Using a Single Optical Imaging Device

Figure 7:
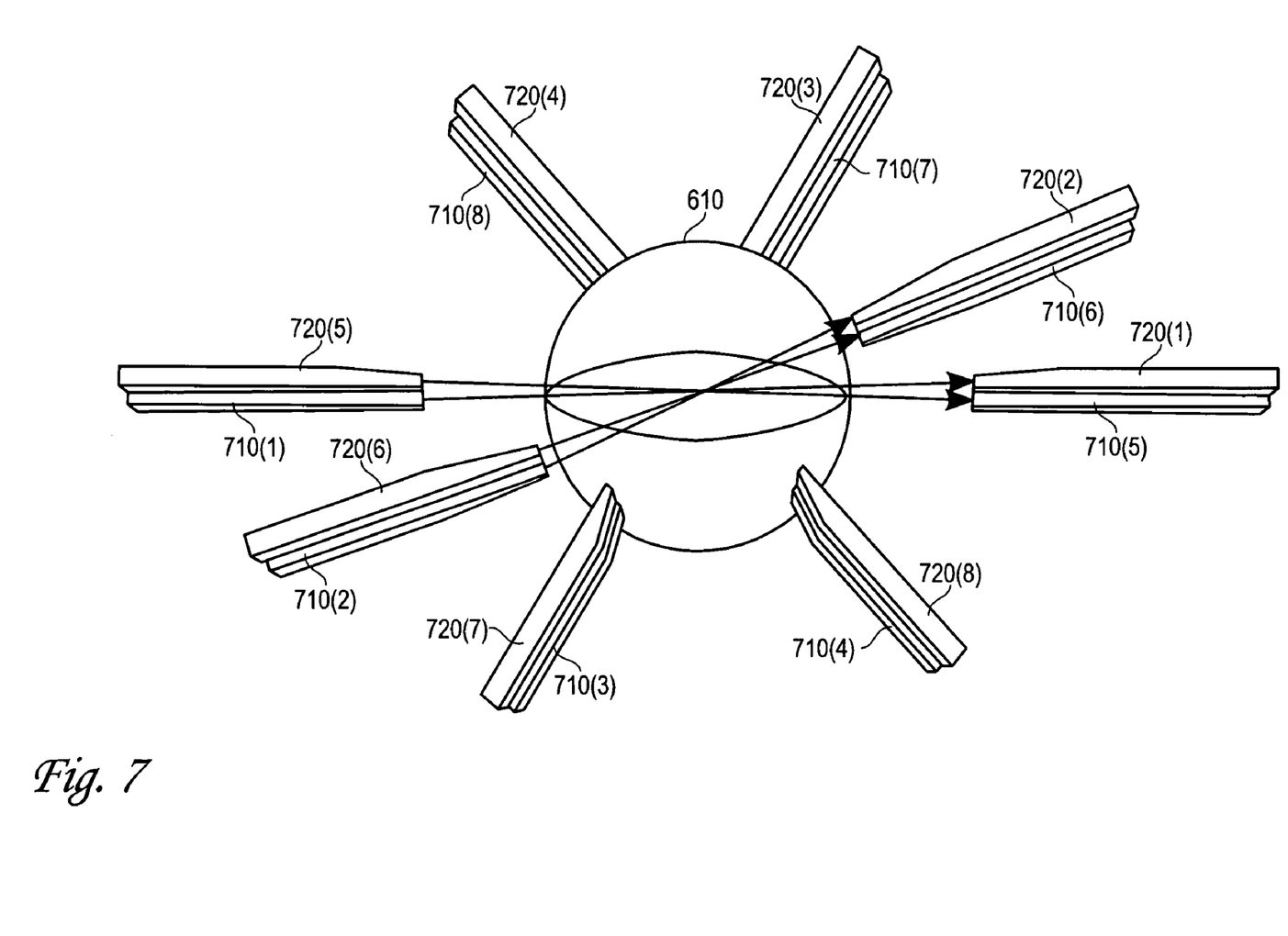
FIG. 7 depicts multiple channels on two electronic devices interconnected by the same optical coupling device, in accordance with an embodiment of the present invention.

Bandwidth-density is scaled by having multiple waveguides share the same optical imaging device 610, in accordance with one embodiment. For example, if the optical imaging device 610 is a sphere, the symmetry allows for positioning input and output waveguides at conjugate positions as shown in FIG. 7. The term "conjugate positions" refers to the positions of the object signal and the image signal, as dictated by the optical properties of the optical imaging device 610. FIG. 7 depicts multiple waveguides on a first electronic device coupled to corresponding waveguides at conjugate positions on a second electronic device, in accordance with an embodiment. In FIG. 7, the lower waveguides 710 (1-8) are on a first electronic device and the upper waveguides 720 (1-8) are on a second electronic device. As a particular example, waveguide 710(1) forms a pair with waveguide 720(1).

The optical signals may cross in the optical imaging device 610 without interference. Thus, a single optical imaging device 610 in a pit can simultaneously image optical signals arriving at different angles from different waveguides on a first chip to corresponding waveguides on a second chip in corresponding opposing positions (e.g., conjugate positions). Optical signals can be transferred bi-directionally on each of the waveguide pairs.

At this point, it should be noted that although the invention has been described with reference to a specific embodiment, it should not be construed to be so limited. Various modifications may be made by those of ordinary skill in the art with the benefit of this disclosure without departing from the spirit of the invention. For example, the waveguides illustrated and described herein are used for purposes of examples. Other types of waveguides can be used. Thus, the invention should not be limited by the specific embodiments used to illustrate it but only by the scope of the issued claims and the equivalents thereof.

What is claimed is:

1. An assembly comprising:
    an optical coupling device having a first portion and a second portion;
    a first electronic device comprising:
        a first substrate having a first pit formed therein; and
        a first optical waveguide; and
    a second electronic device comprising:
        a second substrate having a second pit formed therein; and
        a second optical waveguide;
    wherein the first portion of the optical coupling device is disposed in the first pit;
    wherein the second portion of the optical coupling device is disposed in the second pit;
    wherein the first optical waveguide is positioned relative to the optical coupling device such that a tip of the first optical waveguide is situated to one side of the optical coupling device and is directed at a central portion of the optical coupling device;
    wherein the second optical waveguide is positioned relative to the optical coupling device such that a tip of the second optical waveguide is situated to an opposite side of the optical coupling device and is directed at the central portion of the optical coupling device; and
    wherein the optical coupling device acts as a lens to receive an object signal from the tip of the first optical waveguide on the one side of the optical coupling device and to direct an image signal to the tip of the second optical waveguide on the opposite side of the optical coupling device.

2. The assembly as recited in claim 1, wherein the optical coupling device aligns the first electronic device with the second electronic device.

3. The assembly as recited in claim 1, wherein the first optical waveguide comprises a shape that causes the size of a mode of the first optical waveguide to increase in a region of the first optical waveguide that is nearest to the optical coupling device.

4. The assembly as recited in claim 3, wherein the second optical waveguide comprises a shape that causes the size of a mode of the second optical waveguide to increase in a region of the second optical waveguide that is nearest to the optical coupling device.

5. The assembly as recited in claim 1, wherein:
    the object signal is a first object signal, and the image signal is a first image signal;
    the first electronic device further comprises a third optical waveguide; and
    the second electronic device further comprises a fourth optical waveguide;

the third optical waveguide is positioned relative to the optical coupling device to direct a second object signal to the optical coupling device;

the fourth optical waveguide is positioned relative to the optical coupling device to receive a second image signal, which is directed by the optical coupling device to the fourth optical waveguide; and the optical coupling device optically couples the third optical waveguide to the fourth optical waveguide.

6. The assembly as recited in claim 1, wherein:

the object signal is a first object signal, and the image signal is a first image signal;

the second optical waveguide is positioned relative to the optical coupling device to direct a second object signal to the optical coupling device; and the first optical waveguide is positioned relative to the optical coupling device to receive a second image signal, which is directed by the optical coupling device to the first optical waveguide.

7. The assembly as recited in claim 1, further comprising a region around the first pit to allow for propagation of the object signal between the first optical waveguide and the optical coupling device.

8. The assembly as recited in claim 1, wherein at least a portion of the surface of the optical coupling device comprises a substantially spherical shape.

9. The assembly as recited in claim 1, wherein the optical coupling device comprises at least one of: glass, quartz, and sapphire.

10. The assembly as recited in claim 1, further comprising:

a first alignment device having a first portion and a second portion; and a second alignment device having a first portion and a second portion;

wherein the first substrate comprises a third pit and a fourth pit;

wherein the second substrate comprises a fifth pit and a sixth pit;

wherein the first portion of the first alignment device is disposed in the third pit;

wherein the second portion of the first alignment device is disposed in the fifth pit;

wherein the first portion of the second alignment device is disposed in the fourth pit;

wherein the second portion of the second alignment device is disposed in the sixth pit; and wherein the optical coupling device, the first alignment device, and the second alignment device align the first electronic device with the second electronic device.

11. The assembly as recited in claim 10, wherein the first alignment device is an optical coupling device.

12. The assembly as recited in claim 1, further comprising:

a first alignment device having a first portion and a second portion; and a second alignment device having a first portion and a second portion;

a third electronic device having a third substrate comprising a third pit;

a fourth electronic device having a fourth substrate comprising a fourth pit;

wherein the substrate of the first electronic device further comprises a fifth pit and a sixth pit;

wherein the first portion of the first alignment device is disposed in the third pit;

wherein the second portion of the first alignment device is disposed in the fifth pit;

wherein the first portion of the second alignment device is disposed in the fourth pit;

wherein the second portion of the second alignment device is disposed in the sixth pit; and wherein the optical coupling device, the first alignment device, and the second alignment device align the first electronic device relative to the second electronic device, the third electronic device, and the fourth electronic device.

13. A method of assembling a first electronic device and a second electronic device, wherein:

the first electronic device comprises:

a first substrate having a first pit formed therein; and a first optical waveguide; and a second electronic device comprising:

a second substrate having a second pit formed therein; and a second optical waveguide;

and wherein the method comprises:

disposing a first portion of an optical coupling device in the first pit, wherein the first optical waveguide is positioned relative to the optical coupling device such that a tip of the first optical waveguide is situated to one side of the optical coupling device and is directed at a central portion of the optical coupling device; and disposing a second portion of the optical coupling device in the second pit, wherein the second optical waveguide is positioned relative to the optical coupling device such that a tip of the second optical waveguide is situated to an opposite side of the optical coupling device and is directed at the central portion of the optical coupling device;

wherein the optical coupling device acts as a lens to receive an object signal from the tip of the first optical waveguide on the one side of the optical coupling device and to direct an image signal to the tip of the second optical waveguide on the opposite side of the optical coupling device.

14. The method as recited in claim 13, further comprising etching the first pit in a shape to receive the optical coupling device.

15. The method as recited in claim 13, further comprising forming the first optical waveguide on or in the first substrate such that the tip of the first optical waveguide is a first pre-determined distance from a point of the optical coupling device.

16. The method as recited in claim 15, further comprising forming the second optical waveguide on or in the second substrate such that the tip of the second optical waveguide is a second pre-determined distance from a point of the optical coupling device.

17. The method as recited in claim 16, wherein the first pre-determined distance and the second pre-determined distance are selected such that the object signal exiting from the tip of the first optical waveguide is directed by the optical coupling device as the image signal to the tip of the second optical waveguide.

18. An assembly comprising:

an optical coupling device;

a first electronic device comprising a first substrate and a first optical waveguide on the first substrate; and a second electronic device comprising a second substrate and a second optical waveguide on the second substrate;

wherein the optical coupling device is positioned relative to the first optical waveguide such that a tip of the first optical waveguide is situated to one side of the optical coupling device and is directed at a central portion of the optical coupling device;

wherein the second optical waveguide is positioned relative to the optical coupling device such that a tip of the second optical waveguide is situated to an opposite side of the optical coupling device and is directed at the central portion of; and wherein the optical coupling device acts as a lens to receive an object signal from the tip of the first optical waveguide on the one side of the optical coupling device and to direct an image signal to the tip of the second optical waveguide on the opposite side of the optical coupling device.

19. The assembly as recited in claim 18, wherein the optical coupling device aligns the first electronic device with the second electronic device.

20. The assembly as recited in claim 18, wherein the first optical waveguide comprises a shape that causes the size of a mode of the first optical waveguide to increase in a region of the first optical waveguide that is nearest to the optical coupling device.

21. The assembly as recited in claim 20, wherein the second optical waveguide comprises a shape that causes the size of a mode of the second optical waveguide to increase in a region of the second optical waveguide that is nearest to the optical coupling device.

22. The assembly as recited in claim 18, wherein:
the object signal is a first object signal, and the image signal is a first image signal;
the second optical waveguide is positioned relative to the optical coupling device to direct a second object signal to the optical coupling device; and
the first optical waveguide is positioned relative to the optical coupling device to receive a second image signal, which is directed by the optical coupling device to the first optical waveguide.

23. The assembly as recited in claim 18, wherein at least a portion of the surface of the optical coupling device comprises a substantially spherical shape.

24. The assembly as recited in claim 18, wherein the optical coupling device comprises at least one of: glass, quartz, and sapphire.

* * * * *